United States Patent [19]

Nomura et al.

[11] 4,200,767
[45] Apr. 29, 1980

[54] SUPERCONDUCTOR COVERED WITH REINFORCED ALUMINUM MATRIX

[75] Inventors: Harehiko Nomura, Musashi-Murayama; Kenichi Koyama, Tokorozawa; Kazuhiko Terao, Komoro, all of Japan

[73] Assignee: Agency of Industrial Science & Technology, Tokyo, Japan

[21] Appl. No.: 757,651

[22] Filed: Jan. 7, 1977

[30] Foreign Application Priority Data

Jan. 13, 1976 [JP] Japan ................................ 51-2419

[51] Int. Cl.² ........................................... H01B 12/00
[52] U.S. Cl. .................................. 174/126 S; 29/599; 335/216
[58] Field of Search ................... 174/126 S; 335/216; 29/599; 75/138

[56] References Cited

U.S. PATENT DOCUMENTS

| 3,778,895 | 12/1973 | Nomura | 174/126 S X |
| 3,824,457 | 7/1974 | Strongin | 29/599 X |
| 3,982,906 | 9/1976 | Hirai | 75/138 X |

Primary Examiner—E. A. Goldberg
Attorney, Agent, or Firm—Kurt Kelman

[57] ABSTRACT

Disclosed herein is a superconductor covered with a reinforced aluminum matrix, which is obtained by cladding a superconductor with an aluminum matrix reinforced with a very small proportion of alumina dispersed therein and subjecting the clad superconductor to integral forming by codrawing.

3 Claims, 11 Drawing Figures

SUPERCONDUCTOR COVERED WITH REINFORCED ALUMINUM MATRIX

BACKGROUND OF THE INVENTION

This invention relates to a superconductor covered with a reinforced aluminum matrix and to a method for the manufacture thereof. More particularly, the present invention relates to a superconductor covered with an aluminum matrix which makes the most of the high electric conductivity, the high thermal conductivity and the magneto resistance effect saturation characteristic inherently exhibited by high-purity aluminum at very low temperatures in an extremely high magnetic field and tensile strength and enjoys a notably improved tensile strength such as has heretofore been found difficult to attain by the prior art and to a method for the manufacture of said aluminum superconductor.

As is universally known, a superconductor has a thermal conductivity on the order of $10^{-3}$ to $10^{-2}$ W/cm.deg. which is so low that when an electric current of high current density flows superconductively through said superconductor, the superconductor generates heat due to magnetization, magnetic flux jump or some other cause. Consequently the superconductor transiently or partially shifts to a normally conductive state. Because of this phenomenon, there has been suggested a method for stabilizing the behavior of the superconductor by cladding said superconductor with a normally conductive metal possessed of high electric conductivity and high thermal conductivity. To date, copper of high purity has been used preponderantly as the normal conductive metal. Copper, however, has a disadvantage that the electric resistance thereof increases notably in proportion the magnetic field.

In contrast, aluminum of high purity has its electric resistance increased in a high magnetic field to only about twice the value in an absence of magnetic field. It enjoys the saturation characteristic that the electric resistance no longer varies even if the magnetic field is intensified further. Moreover, aluminum excels copper in electric conductivity and thermal conductivity and has light weight. Thus, aluminum possesses outstanding characteristics as the normal conductive metal. When aluminum of high purity is deposited to directly clad superconductors such as, for example, of an Nb-78% Ti wire and the clad wires are subjected to wire-drawing, because of a broad difference in hardness between the two metals, there ensues a flowing phenomenon wherein only the aluminum layer on the surface is drawn out. Thus, the desired integral forming of the two metals cannot be obtained by co-drawing. Formerly, the present inventors proposed an aluminum clad multiplex superconductor having a uniform cross-sectional distribution of components throughout the entire length by precluding the flowing phenomenon which would otherwise occur while an aluminum clad multiplex superconductor was undergoing wire-drawing (U.S. Pat. Nos. 3,714,371 and 3,778,895). According to the invention of said U.S. patents, the aluminum clad multiplex superconductor is obtained by placing at least three twisted or braided superconductive wires inside a pipe of highly pure aluminum, sheathing said aluminum pipe with a pipe of an aluminum alloy having a Vickers' hardness of not less than 50 and subjecting the resultant composite cable to the wire-drawing, whereby the superconductive wires and the aluminum pipe are integrally drawn out and brought into intimate mutual cohesion. The wire-drawing to be performed on the aluminum pipe and the superconductive wires during the aforementioned manufacture of the aluminum clad superconductor, however, necessitates highly advanced skill. Further, the manufacture of said aluminum clad superconductor necessitates use of at least three twisted superconductive wires.

The object of this invention is to provide a superconductor covered with a reinforced aluminum matrix which makes the most of the high electric conductivity, the high thermal conductivity and the magneto resistance effect saturation characteristic inherently exhibited by aluminum of high purity at very low temperature and enjoys a notably improved tensile strength and also a method for the manufacture of said aluminum clad superconductivity of high tensile strength.

SUMMARY OF THE INVENTION

To accomplish the object described above according to the present invention, there is provided a method for the manufacture of a superconductor covered with a reinforced aluminum matrix, which method comprises cladding superconductor with an aluminum matrix having alumina dispersed therein.

The dispersion type reinforced alloy such as is obtained by having alumina suitably dispersed in a matrix of highly pure aluminum as described above retains, substantially intact, the advantageous characteristics of high electric conductivity and high thermal conductivity exhibited by aluminum of high purity at very low temperature and acquires the high tensile strength as well as the magneto resistance effect saturation characteristic inherently possessed by aluminum. When this reinforced aluminum is used as the material for stabilizing the superconductor, it enjoys ease of fabrication equal to or even superior to that of the conventional material of copper. When a multiplicity of core wires are embedded in the matrix and the resultant composite is subjected simultaneously to the wire-drawing, integral forming of cable can easily be carried out without entailing the flowing phenomenon.

The term "aluminum" as used in the present specification refers to aluminum of high purity sufficient for the residual resistivity at very low temperatures to fall below $5 \times 10^{-8} \Omega \cdot cm$.

The other objects and characteristics of the present invention will become apparent from the description to be given in further detail herein below with reference to the accompanying drawings.

DESCRIPTION OF THE PREFERRED EMBODIMENTS

A superconductor, as is universally known, has a thermal conductivity on the order of $10^{-3}$ to $10^{-2}$ W/cm.deg. which is so low that the superconduction of electric current of high current density transiently or partially shifts to normal conduction owing to generation of heat causable such as by magnetization, magnetic flux jump or some other similar phenomenon. It has been well known to embed in the superconductor a normally conductive metal having high electric conductivity and thermal conductivity and thereby enable the superconductor to retain its stability even in such a difficult situation as described above.

Figure 1:
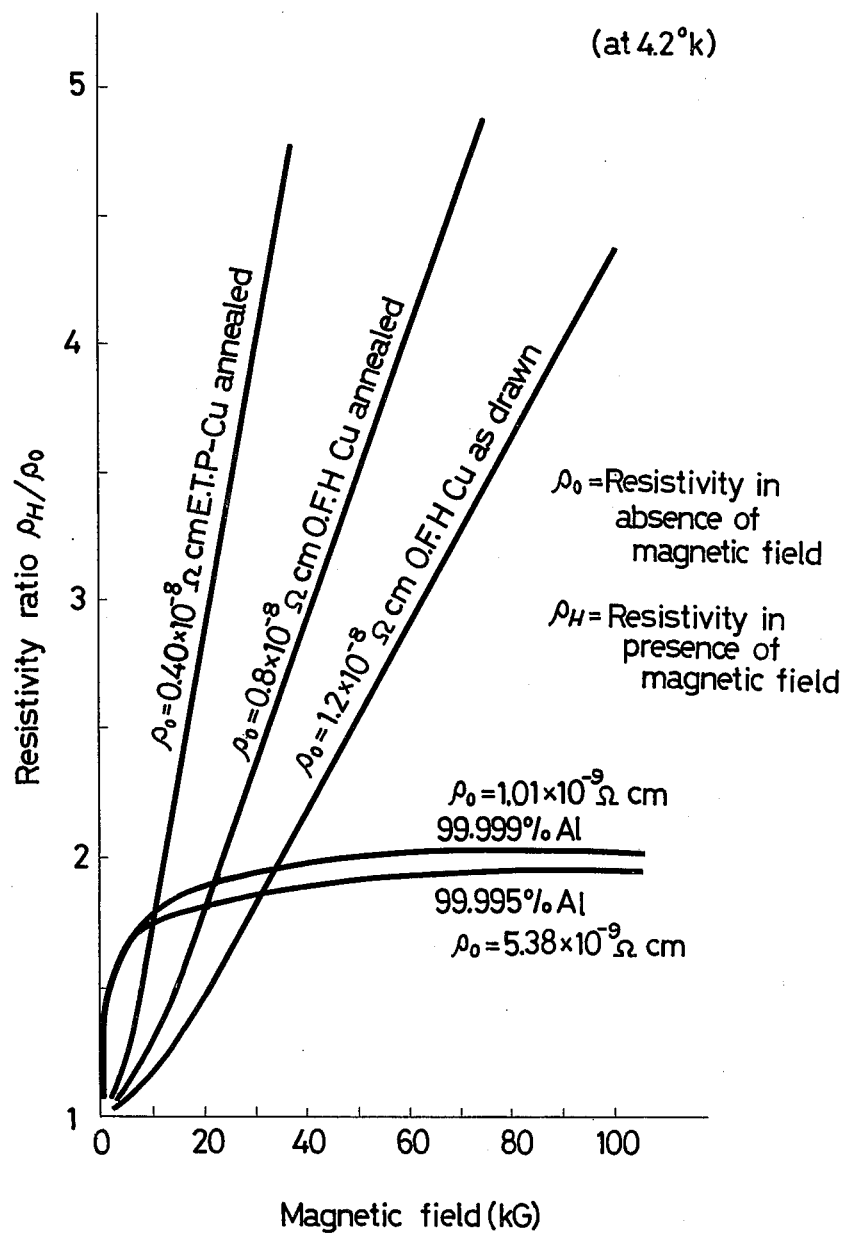
FIG. 1 is a graph showing the relation between the magnetic field and the resistivity ratio as determined of copper and aluminum.

As the normally conductive metal, there has been particularly used copper of high purity. As indicated in FIG. 1, however, copper manifests to an unusual extent the so-called magneto resistance effect, i.e. the phenomenon that the electric resistance increases conspicuously as the intensity of magnetic field increases. When copper is considered as the matrix for a superconductive electromagnet, for example, the resistivity increases roughly by one decimal place, occasionally more, as the magnetic field gains in its intensity, although the magnet possesses a desired level of electric conductivity in the absence of mangetic field. This means that the copper content in the matrix must be increased in proportion to the intensity of the magnetic field to be generated, making the practical design of the electromagnet extremely difficult. What makes the matter worse is the fact that, as is evident from FIG. 1, the increase in the resistance due to the magneto resistance effect becomes increasingly more conspicuous with the increasing purity of copper, so that in a high magnetic field, the advantageous electrical and thermal characteristics ascribable to the high purity of copper are substantially completely offset by the increasing resistance. An attempt to overcome this difficulty by making some adjustment or other on the copper and consequently stabilizing the superconductive electromagnet for generation of magnetic field necessitates use of an excessively large amount of copper to ensure stable generation of high magnetic field. Consequently, the weight of the superconductive electromagnet will become exceedingly large.

In contrast in the case of aluminum of high purity, the electric resistance is increased in an extremely high magnetic field to only about twice the value in an absence of magnetic field, as is evident from FIG. 1. Moreover, the aluminum manifests the saturation characteristic, a phenomenon that the electric resistance remains as it is despite any further increase in the intensity of magnetic field. This fact indicates that the electric resistance is hardly affected by the purity of aluminum. When aluminum of high purity which enjoys these advantages is adopted as the matrix for stabilizing the magnetic field, there will be found numerous advantages such as simplicity of design, notable decrease in the amount of matrix required and generous reduction in the total weight of the superconductive electromagnet.

Now let $d_s$ (kg/m$^3$) stand for the density of the superconductive wire, $d_m$ (kg/m$^3$) for the density of the matrix, $A/a = k$ for the cross-sectional area ratio between the matrix and the superconductive wire, $\rho(\Omega m)$ for the resistivity and $l(m)$ for the length, and the weight $m$ (kg) will be expressed as follows.

$$m = (d_s a + d_m A) l \tag{1}$$

The electric resistance R ($\Omega$) of the matrix will be expressed as follows:

$$R = \rho l / A \tag{2}$$

Substitution of the equation (2) in the equation (1) gives rise to the following equation.

$$m = \rho l^2 / P_k (d_s + k d_m) \tag{3}$$

As the criterion for the comparison of two equivalent electromagnets, one using copper and the other aluminum on the basis of the theory of stabilization of superconductor, the weight ratio M between copper and aluminum to be used as the stabilizing materials under the conditions having the values of R, l and $\rho/K$ fixed will be expressed as follows (provided that there is used a superconductor having $d_s = 5.96 \times 10^3$ kg/m$^3$ for Nb-Ti, $d_m = 2.7 \times 10^3$ kg/m$^3$ for Al and $d_m = 8.9 \times 10^3$ kg/m$^3$ for Cu respectively):

$$M = \frac{1 + k(Cu)\frac{dm}{ds}}{1 + k(Al)\frac{dm}{ds}} = \frac{1 + 1.49\, k(Cu)}{1 + 0.45\, k(Al)} \tag{4}$$

In this case, the following equation is always satisfied. Thus k(Cu) and k(Al) cannot assume their values independently of each other.

Figure 2:
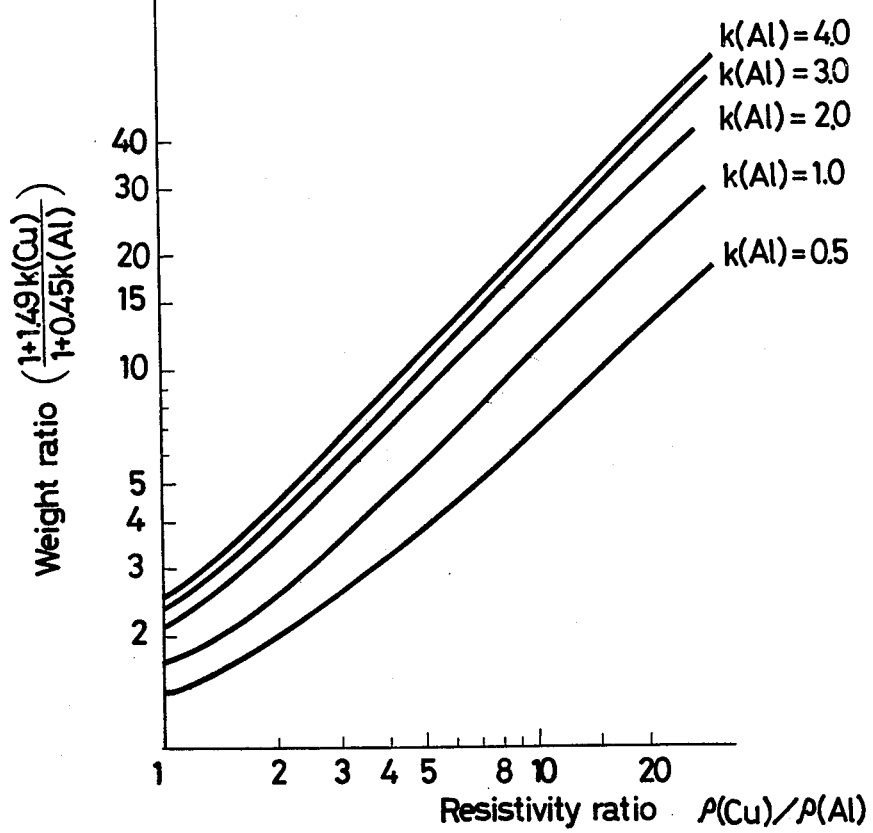
FIG. 2 is a graph showing the relation between the resistivity ratio and the weight ratio with reference to the equivalent magnet as formed by integrally forming the superconductor with copper or aluminum.

FIG. 2 graphically represents the relation of formula (4) given above. From the graph, it is found that when there is selected a material whose resistivity ratio ($\rho(Cu)/\rho(Al)$) is 10, for example, k(Al)=1.0 is obtained for an electromagnet which is formed of aluminum matrix and superconductor at a ratio of 1:1 and that in an equivalent electromagnet using a copper matrix instead of the aluminum matrix, k(Cu)=10 is obtained. In this case the weight ratio is 10, suggesting that the electromagnet using the material according to the present invention has a weight only one tenth of the weight of the countertype using copper as the material. This relation does not reflect the magneto resistance effect. If said effect is taken into consideration, then there will be inevitably required due correspondence to a fairly large value of the ratio of $\rho(Cu)/\rho(Al)$. Consequently, the weight and the volume will become greater.

Though aluminum of high purity possesses more desirable properties than copper, it has never been adopted for the stabilization of magnetic field. The reason is that since aluminum of high purity has low tensile strength and unusually low hardness as already pointed out, the technical difficulty encountered in the course of its fabrication has made it impracticable to permit a multiplicity of core wires to be simultaneously embedded in the aluminum matrix or use the aluminum in high magnetic field without the presence of a reinforcing material. Aluminum of high purity, if used as the sole superconductor, exhibits outstanding properties. Under conditions involving heavy electric current, large energy capacity and high magnetic field, however, the super-conductors of high-purity aluminum themselves suffer drawbacks from the standpoint of physical application. To be specific, as the superconductive electromagnet enlarges, the energy builds up therein to the extent of exerting stress on various points of the electromagnet. Each of the stresses is divided into a radial compressive force and a linear tensile force. Since the requirements are generally stricter for the linear tensile force than for the radial compressive force, the tensile strength alone will be discussed herein as the criterion for strength for the sake of convenience. In the case of a solenoid electromagnet, the distribution of stress with reference to the radial direction from the center is expressed as follows:

$$\delta(r) = (10^{-6}/9.8) H(\lambda \cdot J) r \qquad (5)$$

Here, $\delta(r)$ denotes the linear stress (kg/cm$^2$) at a distance of the radius (r cm) from the axis, H the magnetic field (gauss) and $\lambda \cdot J$ (A/cm$^2$) the average current density in the cross section of the coil. As is readily understood from this formula (5), where no reinforcing material is used, the electric current permitted to flow through the superconductor is to be heavily restricted by the limited tensile strength because the stress developing within the electromagnet increases in direct proportion to the increase in the radius of the electromagnet, notwithstanding the fact that the current density of the superconductor may successfully be increased by the stability which is brought about by the use of aluminum of high purity.

The present invention has been accomplished with a view to overcoming the disadvantage just described. To be more specific, the present invention has issued from successful realization of the attempt to make the most of the excellent behavior exhibited by aluminum of high purity in the stabilization of superconductor and, at the same time, augment to a considerably higher extent the tensile strength and the hardness of aluminum of high purity which are both low and has heretofore constituted the demerits thereof.

Now, the aluminum of high purity which is used in the present invention will be described. Normally, the individual particles of powdered aluminum of high purity have their surface covered with a very thin oxidized coat. Further, the individual particles of high-purity aluminum have different specific surface areas (surface area/volume) from one another owing to the variation in their particle diameter. An experiment conducted by using two samples of aluminum powder, one having an average particle diameter of 37$\mu$ and the other 44$\mu$ respectively, for instance, will be described: Each sample of high-purity aluminum powder was placed to fill a rubber container, compacted into a unitary mass by a treatment with a static water pressure and finally given an integral forming. Thereafter, each sample was given a heat treatment at about 665° C. Thus were obtained test specimen "A" (37$\mu$ of particle diameter) and test specimen "B" (44$\mu$ of particle diameter). The two test specimens were measured for tensile strength. The results were as shown in Table 1 below. The tensile strength of pure copper and that of pure aluminum are indicated in the table for comparison.

Table 1

| | |
|---|---|
| Test Specimen A (37 $\mu$ of diameter) | 32 kg/mm$^2$ |
| Test Specimen B (44 $\mu$ of diameter) | 22 kg/mm$^2$ |
| Pure copper | about 23 kg/mm$^2$ |
| Pure aluminum | about 5 kg/mm$^2$ |

It is seen from Table 1 that the test specimen "A" excelled pure copper in tensile strength. An aluminum composite having a tensile strength equal to or superior to that of pure copper can be obtained by suitably selecting the particle diameter of aluminum powder. In the individual aluminum particles, alumina is deposited to a thickness of about 30—80 Å on the surface of said particles. In consequence of said integral forming work, the alumina is finely divided and distributed throughout the mass of aluminum particles, giving desirable reinforcement to the resultant formed article of aluminum. The amount of alumina thus dispersed within the formed article is about 0.8% by volume in the aluminum powder 37$\mu$ in average particle diameter, about 0.3% by volume in the aluminum powder 44$\mu$ in average particle diameter and about 1.5% by volume in the aluminum powder 22$\mu$ in average particle diameter respectively.

Then, three samples of aluminum powder having a fixed particle diameter of 37$\mu$ and differing in purity as indicated in the table below were subjected to the rubber-compression treatment and the heat treatment as described above. The resultant test specimens were measured for electric resistance at 4.2° K. The results of the measurement were as shown below.

Table 2

| Purity of aluminum powder (%) | Electric resistance ($\Omega \cdot$ cm) |
|---|---|
| 99.9 | $\sim 9 \times 10^{-8}$ |
| 99.99 | $\sim 2 \times 10^{-8}$ |
| 99.999 | $\sim 6 \times 10^{-9}$ |

It is understood from the preceding table that all the aluminum powders tested were amply usable as the matrix in the superconductor.

Figure 3A:
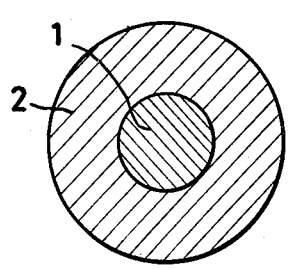
FIG. 3(a) and (3b) are cross-sectional views illustrating the fundamental structure of the aluminum superconductor of high tensile strength manufactured by the present invention.

Now, a description will be given concerning the superconductor which uses as the cladding material the high-purity aluminum treated as described above. FIG. 3(A) is a corss-sectional view of the fundamental construction of a superconductor in accordance with this invention, comprising one superconductor 1 clad with a high-purity reinforced aluminum matrix 2 of augmented tensile strength. FIG. 2(B) is a similar cross-sectional view, except a plurality of superconductors are clad with the high-purity reinforced aluminum matrix. When the superconductor(s) is clad with a high-purity reinforced aluminum matrix of augmented tensile strength as illustrated therein, the excellent electrical and thermal properties which aluminum of high purity exhibited as described above at very low temperatures are advantageously utilized in stabilizing the superconductor(s) and the augmented tensile strength brought about by uniform dispersion of alumina particles is great enough to withstand various heavy stresses which build up within the superconductive electromagnet of a high magnetic field and a large energy capacity.

The method of the present invention for the manufacture of an aluminum clad superconductor will be specifically described below with reference to FIG. 4.

A high-purity aluminum powder covered alumina of the nature of spontaneous occurrence having a suitable particle diameter is placed to fill a rubber container, compacted into a unitary mass by a static water pressure and heated at about 665° C. to produce an aluminum matrix 2' containing a multiplicity of bored holes 3.

Figure 4A:
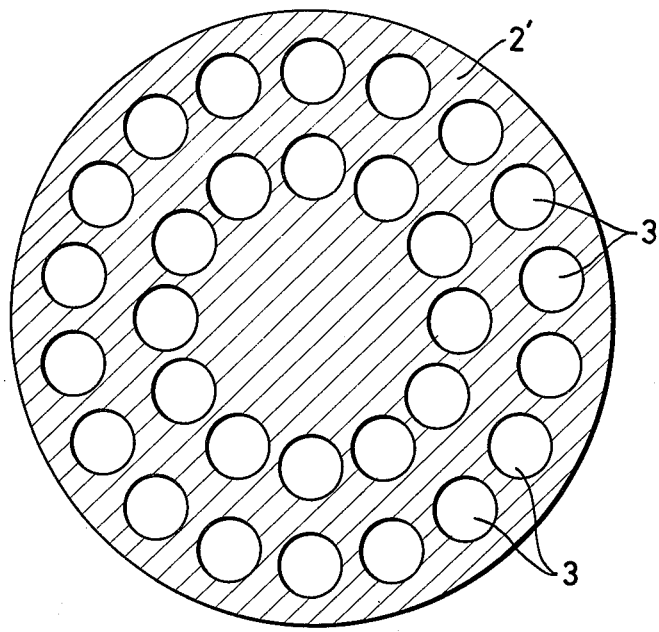
FIGS. 4(a), 4(b), 4(c), 4(d), 4(e), 4(f), and 4(g) are cross-sectional views illustrating the process of manufacture of the aluminum superconductor of high tensile strength according to the present invention.
Figure 4B:
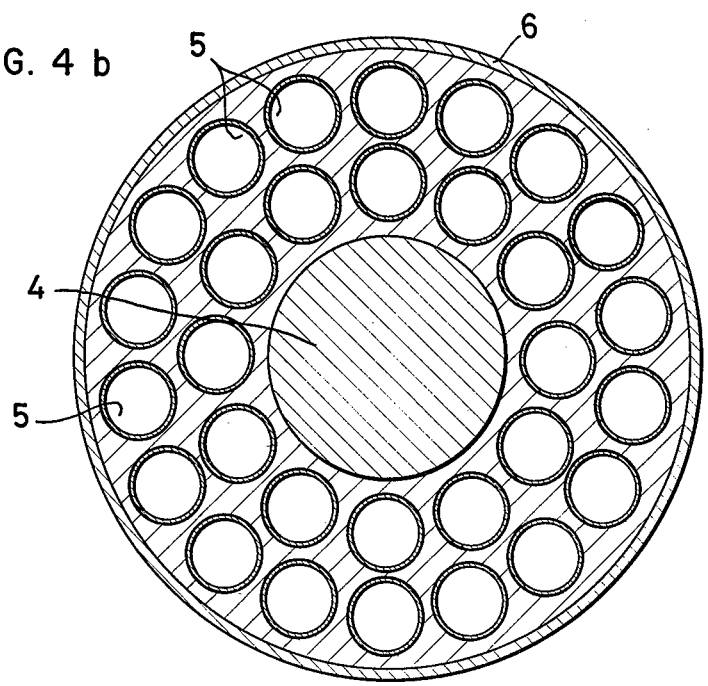

Subsequently, a rod 4 of high-purity reinforced aluminum is held in position as illustrated in FIG. 4(B) and a plurality of high-purity aluminum pipes 5 are inserted therein. The rod 4 and the pipes 5 thus combined are wholly inserted into a pipe 6 made of a material such as an aluminum alloy which has a hardness equal to or greater than that of high-purity aluminum. This pipe 6 has the sole function of reinforcing the superconductor.

Figure 3B:
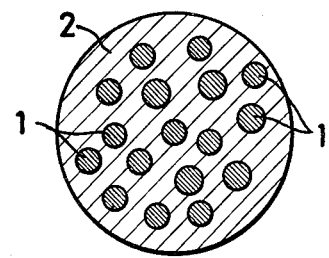
Figure 4C:
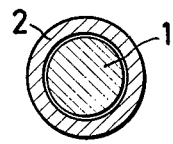
Figure 4D:
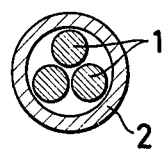
Figure 4E:
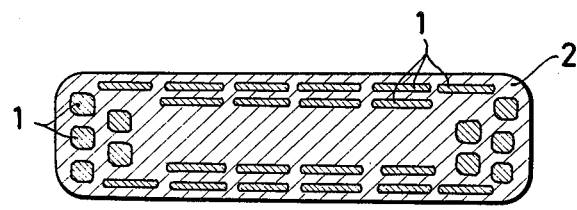
Figure 4F:
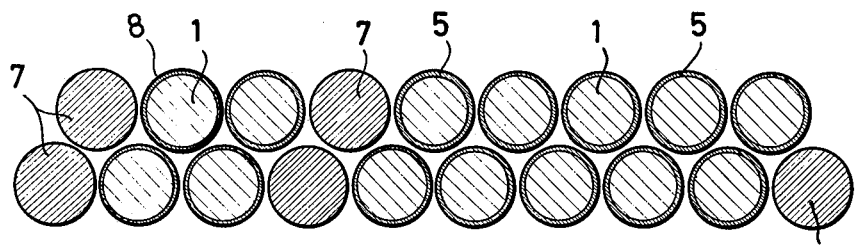
Figure 4G:
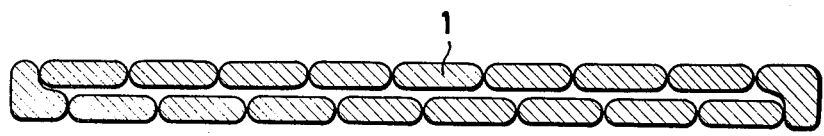

It may be replaced with stainless steel wires, therefore, to suit the particular use to be involved. This insertion of the reinforcing material may otherwise be omitted completely as illustrated in FIG. 4(A). As the pipe 5 to be used for insertion as shown in FIG. 4(B), there is used that which has a sole superconductor 1 clad with a high-purity reinforced aluminum matrix 2 of augmented tensile strength as illustrated in FIG. 4(C) or that which has a plurality (three) superconductors 1 clad with a high-purity reinforced aluminum matrix 2 of augmented tensile strength as shown in FIG. 4(D). In this case, the superconductor(s) may be inserted simply inside the pipe of high-purity aluminum of augmented tensile strength or the superconductor(s) stabilized with reinforced aluminum by integral forming as illustrated in FIG. 3 may be inserted. For the purpose of precluding possible loss of stability due to time-course change of magnetic field, the superconductor may be twisted with a suitable pitch and inserted in the twisted state into the aforementioned pipe. The composite material obtained preparatory to the wire-drawing in the state illustrated in FIG. 4(B) is now subjected to wiredrawing and thereafter is flattened by means of a roller, for example. The superconductor which is thus finished in a flattened shape as illustrated in FIG. 4(E) has the advantage that the ratio of the volume occupied by the superconductive electromagnet to the entire volume of the superconductor is greater. FIG. 4(F) is a cross-sectional view of the construction having a plurality of high-purity aluminum pipes 5 of augmented tensile strength intertwined or braided with reinforcing wires 7 (such as of stainless steel). Said high-purity aluminum pipes 5 of augmented tensile strength have their outer surface 8 electrically insulated by anodic oxidation so as to alleviate possible loss caused by the combined current generated in consequence of the time-course change of magnetic field. This type of cable is adopted for applications involving a pulse current or alternating current. FIG. 4(G), though depicting a concept identical with that of FIG. 4(F), illustrates a construction finished in a flattened shape by use of a roller, for example, with a view to increasing the ratio of the volume occupied by the superconductive electromagnet to the whole volume involved. After such a fabrication, an alumina layer having a powerful electrically insulating activity may be formed at any desired time by an anodic-oxidation coating treatment. The electric insulation of this type has thermal conductivity of a level two decimal places higher than that of the conventional organic insulating substance (such as, for example, polyvinyl formvar) and yet has a thickness one decimal place smaller (a thickness less than $1\mu$ being sufficient). Consequently, it far excels the conventional insulating substance particularly in heat-expelling effect. Further, this insulating coat withstands radioactive rays and neutral rays more strongly than the organic insulating substances. Thus, the electric insulation provided by this coat functions effectively against the radioactive rays such as from the nuclear fusion furnaces.

The reinforcement of the high-purity aluminum matrix in the present invention has been described as being effected through dispersion of the alumina layer formed on the surface of individual particles of high-purity aluminum. The desired reinforcement may be accomplished otherwise than by resorting to the method just described. For example, it may be accomplished by causing a suitable amount of alumina to be mixed into and dispersed throughout a molten mass of high-purity aluminum held in a crucible such as by means of ultrasonic waves.

As described above, the outstanding electrical and thermal properties exhibited by high-purity aluminum at very low temperatures can be utilized by the present invention for stabilizing the superconductor, while such utilization has heretofore been held impracticable. Besides, this invention permits the superconductor to acquire tensile strength high enough to withstand various heavy stresses which build up in the superconductive electromagnet of high magnetic field and large energy capacity. Because of high current density, high ability to stabilize the magnetic field, light weight, etc., the superconductor to be obtained by the present invention is believed to find a wide variety of uses, among others, as electromagnets for MHD power generation, electromagnets for particle acceleration, electromagnets for nuclear fusion, electromagnets for lasers, electromagnets for pulse current generation, electromagnets for linear motor flotation, electromagnets for medical therapy, bending magnets for foam boxes, magnets for missiles and cables for power transmission.

What is claimed is:

1. A superconductor covered with an aluminum matrix of augmented tensile strength, which comprises at least one superconductive wire and an aluminum matrix laid to cover the outer surface of said at least one superconductive wire and having alumina dispersed therein, said at least one superconductive wire and said aluminum matrix having been co-drawn.

2. The superconductor according to claim 1, wherein said aluminum matrix has alumina dispersed therein in a total amount of from about 0.3 to about 1.5 percent by volume.

3. A multifilamentary superconductor comprising a plurality of superconductive wires separated from one another and surrounded by a matrix of composite material consisting essentially of aluminum with alumina dispersed therein, the wires and matrix having been co-drawn.

* * * * *